United States Patent
Tsujimoto

(10) Patent No.: US 8,575,749 B2
(45) Date of Patent: Nov. 5, 2013

(54) SEMICONDUCTOR DEVICE AND METHOD FOR FABRICATING THE SAME

(75) Inventor: Shinya Tsujimoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/525,734

(22) Filed: Jun. 18, 2012

(65) Prior Publication Data

US 2012/0256312 A1 Oct. 11, 2012

Related U.S. Application Data

(63) Continuation of application No. PCT/JP2010/005381, filed on Sep. 1, 2010.

(30) Foreign Application Priority Data

Jan. 5, 2010 (JP) .................................. 2010-000409

(51) Int. Cl.
*H01L 21/60* (2006.01)

(52) U.S. Cl.
USPC .... 257/737; 257/778; 257/795; 257/E23.121; 438/108; 438/112; 438/118; 438/612

(58) Field of Classification Search
USPC ......... 438/406, 455, 612–617, 108, 112, 127, 438/118; 257/778–780, E21.503, 737, 687, 257/788–789, 795, E23.121, E21.499, 257/E23.021; 156/145
See application file for complete search history.

(56) References Cited

U.S. PATENT DOCUMENTS

| | | | | |
|---|---|---|---|---|
| 6,415,974 | B2 * | 7/2002 | Jao ................................ | 228/215 |
| 6,583,039 | B2 * | 6/2003 | Chen et al. .................... | 438/612 |
| 7,271,084 | B2 * | 9/2007 | Jeong et al. ................... | 438/613 |
| 7,331,106 | B2 * | 2/2008 | Workman et al. ............... | 29/840 |
| 7,361,990 | B2 * | 4/2008 | Lu et al. ......................... | 257/738 |
| 7,423,346 | B2 * | 9/2008 | Lin et al. ........................ | 257/758 |
| 7,456,503 | B1 * | 11/2008 | Li ................................. | 257/778 |
| 7,667,336 | B2 * | 2/2010 | Ishio ............................. | 257/781 |
| 7,793,818 | B2 * | 9/2010 | Tago et al. ............... | 228/180.22 |

(Continued)

FOREIGN PATENT DOCUMENTS

| | | |
|---|---|---|
| JP | 11-163014 | 6/1999 |
| JP | 2005-268442 | 9/2005 |

(Continued)

OTHER PUBLICATIONS

Machine Translation of JP,2005-268442 on Dec. 20, 2012.*

(Continued)

*Primary Examiner* — Jarrett Stark
*Assistant Examiner* — Bitew Dinke
(74) *Attorney, Agent, or Firm* — McDermott Will & Emery LLP

(57) ABSTRACT

A semiconductor device includes a semiconductor chip, an electrode pad formed on the semiconductor chip, an underlying barrier metal formed on the electrode pad, a solder bump formed on the underlying barrier metal, and an underfill material surrounding the underlying barrier metal and the solder bump. A junction interface of the solder bump with the underlying barrier metal corresponds to an upper surface of the underlying barrier metal, and a portion of the underfill material bonded to a side surface of the solder bump and an end surface of the underlying barrier metal forms a right angle or an obtuse angle.

11 Claims, 7 Drawing Sheets

(56) References Cited

U.S. PATENT DOCUMENTS

| | | | |
|---|---|---|---|
| 2003/0218258 A1* | 11/2003 | Charles et al. | 257/783 |
| 2005/0014355 A1* | 1/2005 | Chan et al. | 438/613 |
| 2009/0108446 A1 | 4/2009 | Nagai | |
| 2010/0015796 A1* | 1/2010 | Tago et al. | 438/614 |
| 2010/0093135 A1* | 4/2010 | Lii et al. | 438/127 |
| 2011/0101527 A1* | 5/2011 | Cheng et al. | 257/738 |
| 2011/0241202 A1* | 10/2011 | Liu et al. | 257/737 |
| 2012/0025369 A1* | 2/2012 | Kao et al. | 257/737 |
| 2012/0295434 A1* | 11/2012 | Cho et al. | 438/614 |

FOREIGN PATENT DOCUMENTS

| | | |
|---|---|---|
| JP | 2008-218759 | 9/2008 |
| JP | 2009-124099 | 6/2009 |
| WO | WO 2009/122867 A1 | 10/2009 |

OTHER PUBLICATIONS

International Search Report issued in International Patent Application No. PCT/JP2010/005381 dated Nov. 16, 2010.

* cited by examiner

SEMICONDUCTOR DEVICE AND METHOD FOR FABRICATING THE SAME

CROSS-REFERENCE TO RELATED APPLICATION

This is a continuation of PCT International Application PCT/JP2010/005381 filed on Sep. 1, 2010, which claims priority to Japanese Patent Application No. 2010-000409 filed on Jan. 5, 2010. The disclosures of these applications including the specifications, the drawings, and the claims are hereby incorporated by reference in their entirety.

BACKGROUND

The present disclosure relates to semiconductor devices and methods for fabricating the same, and more particularly relates to a semiconductor device in which an underlying barrier metal is formed on an external electrode terminal, and which includes a semiconductor chip flip-chip mounted to a circuit wiring board, and a method for fabricating the same.

In recent years, with progress toward downsizing of, e.g., information communication equipment and office electronic equipment and improvement in the performance thereof, downsizing and an increase in the number of external terminals for input and output are demanded of semiconductor devices mounted in such electronic equipment.

In contrast, with significant progress in semiconductor fabrication processes, progress has been made also in miniaturization of the semiconductor chip structure and an increase in the degree of integration thereof, and thus, a so-called low-k film with a low dielectric constant has tended to be used as an interlayer insulating film.

The physical strength of a low-k film is significantly lower than that of a conventional insulating film, and thus, an active region of a semiconductor chip is susceptible to damage arising from external stress, etc. To prevent this, when semiconductor chips in which progress has been made toward miniaturization and an increase in the degree of integration are to be connected to external circuits, in particular, in flip-chip fashion, attention has been given to fusion bonding using solder bumps.

Features of semiconductor chips having been developed in recent years include flip-chip mounting in which an electrode pad is formed on an active region, and an interlayer insulating film for which a low-k material is used. However, the use of such a mounting method and such a material reduces the reliability of semiconductor chips.

When the material of a semiconductor chip is different from the material of a circuit wiring board on which the semiconductor chip is mounted, displacement between the semiconductor device and the circuit wiring board is often caused due to a difference in coefficient of thermal expansion therebetween. The caused displacement causes stress-induced strains on bumps providing connection between the semiconductor device and the circuit wiring board, and the stress-induced strains result in destruction of the junction interfaces between bumps for flip-chip mounting and electrode pads. To address stress-induced strains arising from thermal expansion, surrounding regions of electrode pads are filled with an underfill material or a sealing resin material (hereinafter together referred to an underfill material).

However, the underfill material contains a filler having a strength which allows mitigation of the effect of stress-induced strains arising from thermal expansion, and a solvent. Therefore, when the shape of a region to be filled with the underfill material is complicated, the region is not uniformly filled with the filler, and thus, is filled with only the solvent. In this case, when the underfill material is cured by heat, the filler is in close contact with bumps at the contact surfaces between the filler and the bumps in the region filled with the filler, thereby forming a structure which is strong enough to withstand strains, etc. In contrast, in the region filled with only the solvent, the solvent is vaporized by heat, and thus, voids or bubbles (hereinafter together referred to as voids) are formed. As a result, cracks are formed from voids formed on the junction interfaces between the bumps and the electrode pads, and the formed cracks reduce the reliability of the semiconductor chip, i.e., the semiconductor device.

To reduce the load on semiconductor chips, a method has been presented in which in order to reduce stress concentration on a connection interface of solder bumps providing physical connection between a semiconductor chip and a circuit wiring board due to the difference in thermal expansion therebetween, an annular resist film is formed around a region on which a solder bump is formed (see, e.g., Japanese Patent Publication No. 2005-268442). When the solder bump is formed, and then, a surrounding region of the solder bump is to be filled with an underfill material, the annular resist film protects a surrounding region of an electrode pad to prevent the underfill material from penetrating the junction interface between the solder bump and the electrode pad.

As described above, a flip-chip method in which a semiconductor chip includes electrode pads formed on an active region, and is connected to an external circuit through external connection terminals called bumps has been employed in general. Furthermore, with significant progress in the semiconductor fabrication process, progress has been made also in miniaturization of the semiconductor device structure and an increase in the degree of integration thereof, and thus, a low-k film with a low dielectric constant has tended to be used as an interlayer insulating film. Thus, in order to reduce thermal stress from external connection terminals to electrode pads, efforts have been made as described in, e.g., Japanese Patent Publication No. 2005-268442.

However, with further downsizing, miniaturization, and an increase in the degree of integration of semiconductor devices, situations are arising where the reliability of semiconductor chips cannot be maintained. Here, in future, there is an urgent need to reduce the load on electrode pads on which bumps are formed, in particular, to reduce the pitch between adjacent bumps, i.e., to provide a technique which can accommodate pitches of, e.g., 50-200 μm.

A semiconductor device is made of silicon (Si), gallium arsenide (GaAs), or any other material, and an inorganic material, such as glass, aramid fibers, or ceramic, and a metal material, such as copper (Cu), are used for a circuit wiring board. Thus, as described above, a material of the semiconductor device is different from a material of the circuit wiring board on which the semiconductor device is mounted.

A process for fabricating a semiconductor device includes a process step of heating a semiconductor substrate at approximately 250-300° C.; a semiconductor chip containing silicon as a main ingredient has a coefficient of thermal expansion of 3 ppm/° C.; and a circuit wiring board containing glass fibers as a main ingredient has a coefficient of thermal expansion of approximately 10 ppm/° C. This causes a difference in the degree of expansion between the semiconductor chip and the circuit wiring board when the semiconductor chip and the circuit wiring board are heated. Here, displacement between the semiconductor device and the circuit wiring board due to the difference in the coefficient of thermal expansion therebetween causes stress-induced strains on bumps providing connection therebetween. The caused stress-induced strains result in destruction of the bumps, leading to poor electrical connection.

In Japanese Patent Publication No. 2005-268442, as illustrated in FIG. 8, a semiconductor chip 101 includes an electrode pad 102 selectively formed on the semiconductor chip 101, an underlying barrier metal (UBM) 110 covering the electrode pad 102, and a solder bump 106 formed on the UBM 110. Here, the UBM 110 is formed such that an outer portion of the UBM 110 is astride the inner edge of an insulating film 109 formed around the electrode pad 102. An annular resist film 126 is formed on the insulating film 109, and the inner end surface of the resist film 126 is in contact with the end surface of the UBM 110 and the end surface of the solder bump 106. As such, the annular resist film 126 is formed outside the solder bump 106 to prevent separation of the UBM 110 due to stress caused in the vicinity of the junction between the solder bump 106 and the electrode pad 102 in a heating and cooling cycle after flip-chip mounting. Specifically, when the annular resist film 126 is formed on a region of the semiconductor chip 101 located around the electrode pad 102, this allows the solder bump 106 to be fixed, and thus, can improve the connection between the bump 106 and the UBM 110.

SUMMARY

However, the conventional semiconductor device has a problem when an underfill material 118 is injected into a space surrounding the solder bump 106.

The space surrounding the solder bump 106 is filled with the underfill material 118 in order to enhance the bond strength of the solder bump 106, and the underfill material 118 is obtained by adding a filler 119, as a material having a strength allowing mitigation of the effect of stress-induced strains arising from thermal expansion, to a solvent. The filler 119 is particulate, and when the space is filled with the underfill material 118, the underfill material 118 penetrate into the space along the outer edge of the solder bump 106 through capillary action.

Here, as illustrated in FIG. 8, when the angle θ1 of a fill region 120 of the underfill material 118 located on the resist film 126 is acute, a space which is large enough to be uniformly filled with the filler 119 cannot be provided, and thus, the fill region 120 is not filled with the filler 119, and is filled with only the solvent. In such a circumstance, when the underfill material 118 is cured by heat, the solvent is vaporized, and thus, a void 121 is formed in a space in which the solvent has been vaporized. The void 121 formed in the vicinity of the junction interface between the solder bump 106 and the UBM 110 provides a region in which the solder bump 106 and the underfill material 118 are not in close contact with each other. As a result, the solder bump 106 cannot maintain the rigidity resulting from the close contact with the underfill material 118, and a crack 122 is formed from the void 121 on the outer edge of the solder bump 106 due to subsequent stress caused by heating and cooling.

An object of the present disclosure is to solve the above problem, and obtain a bump and a UBM structure which can accommodate a reduction in the pitch between adjacent bumps while maintaining their strengths.

In order to achieve the above object, a semiconductor device of the present disclosure is configured to provide a large region to be filled with an underfill material in the vicinity of the junction between a bump and an underlying barrier metal.

Specifically, a semiconductor device of the present disclosure includes: a semiconductor chip; an electrode pad formed on the semiconductor chip; an underlying barrier metal formed on the electrode pad; a bump formed on the underlying barrier metal, and made of metal; and an underfill material surrounding the underlying barrier metal and the bump. A junction interface of the bump with the underlying barrier metal is formed on an upper surface of the underlying barrier metal, and a portion of the underfill material bonded to a side surface of the bump and an end surface of the underlying barrier metal forms a right or obtuse angle.

According to the semiconductor device of the present disclosure, the junction interface of the bump made of metal with the underlying barrier metal corresponds to the upper surface of the underlying barrier metal, and the portion of the underfill material bonded to the side surface of the bump and the end surface of the underlying barrier metal forms a right or obtuse angle. This allows a space between the bump and the underlying barrier metal to be also uniformly filled with the necessary amount of the underfill material containing the filler, and thus, the bump and the filler are in close contact with each other, thereby forming an interface between the bump and the filler. This provides an electrode structure which can withstand both stress arising from heating and cooling and physical stress.

In the semiconductor device of the present disclosure, the end surface of the underlying barrier metal may form an arc shape in which a central portion of the underlying barrier metal in a thickness direction of the underlying barrier metal is bent inward.

In the semiconductor device of the present disclosure, the underfill material may contain a filler, and a particle size of the filler may be smaller than a thickness of the underlying barrier metal.

A method for fabricating a semiconductor device of the present disclosure includes: forming an electrode pad on a semiconductor integrated circuit formed on a semiconductor substrate; selectively forming a mask member around the electrode pad on the semiconductor integrated circuit; forming an underlying barrier metal on the electrode pad exposed from the mask member; forming a bump made of metal on the underlying barrier metal exposed from the mask member; forming a semiconductor chip by dicing the semiconductor substrate on which the bump is formed, and placing the bump of the formed semiconductor chip so as to be opposed to a wiring board, thereby flip-chip mounting the semiconductor chip on the wiring board; removing the mask member; and after the removing of the mask member, injecting an underfill material between the semiconductor chip and the wiring board.

The method of the present disclosure includes, between the flip-chip mounting and the injecting of the underfill material, removing the mask member formed around the electrode pad. This can increase the angle formed by the side surface of the bump made of metal and the end surface of the underlying barrier metal at the junction between the bump and the underlying barrier metal to a right or obtuse angle. This allows a space between the bump and the underlying barrier metal to be also uniformly filled with the necessary amount of the underfill material containing the filler, and thus, the bump and the filler are in close contact with each other, thereby forming an interface between the bump and the filler. This provides an electrode structure which can withstand both stress arising from heating and cooling and physical stress.

In the method of the present disclosure, an end surface of the mask member located near the electrode pad may form an arc shape in which a central portion of the mask member in a thickness direction of the mask member is bent toward the electrode pad.

In the method of the present disclosure, the mask member may be an O ring made of a resist material, a film-like resist material, or a resist.

In the method of the present disclosure, the underfill material may contain a filler, and a particle size of the filler may be smaller than a thickness of the underlying barrier metal.

In the method of the present disclosure, in the forming of the bump, electroplating, ball mounting, or screen printing may be used.

The semiconductor device according to the present disclosure and the method for fabricating the same can mitigate stress-induced strain on a bump junction, and can provide a bump and a UBM structure which can accommodate a reduction in the pitch between bumps while maintaining bond strength.

DETAILED DESCRIPTION

Embodiment

An embodiment of the present disclosure will be described with reference to FIG. 1.

Figure 1:
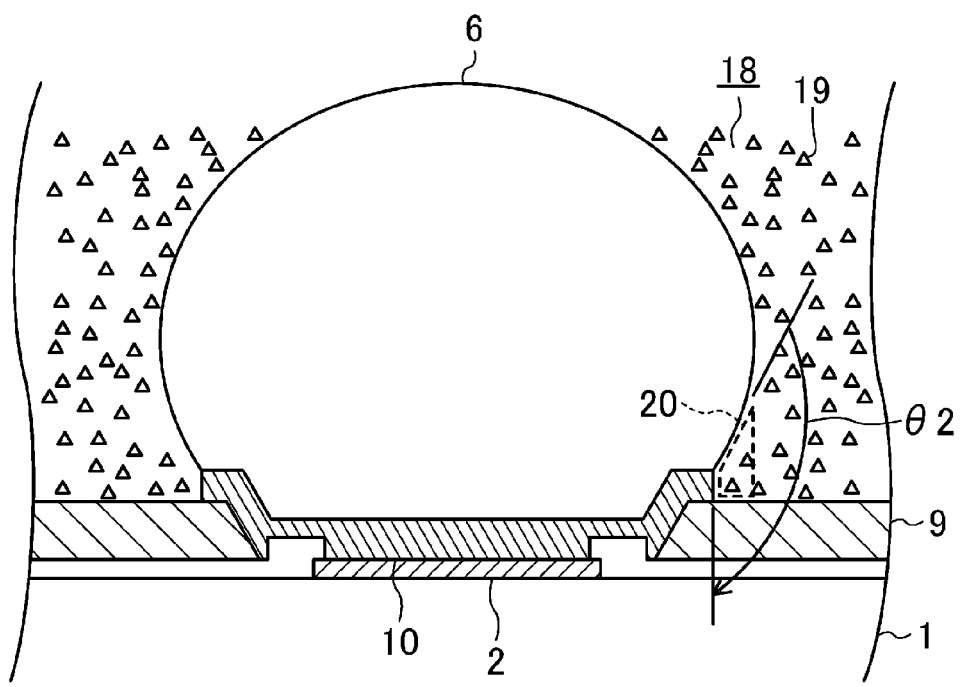
FIG. 1 is a partial schematic cross-sectional view illustrating a region, which includes a bump and a UBM, of a semiconductor device according to an embodiment of the present disclosure.

As illustrated in FIG. 1, a semiconductor device of this embodiment includes an electrode pad 2 selectively formed on a semiconductor chip 1, an underlying barrier metal (UBM) 10 covering the electrode pad 2, and a solder bump 6 formed on the UBM 10, and the electrode pad 2, the UBM 10, and the solder bump 6 form a bump structure. Here, the UBM 10 is formed such that an outer portion of the UBM 10 is astride the inner edge of an insulating film 9 formed around the electrode pad 2.

Space on the insulating film 9 and the side surfaces of the solder bump 6 and UBM 10 is filled with an underfill material 18 to which a filler 19 has been added.

Here, a feature of this embodiment is that the solder bump 6 has a junction interface only with the upper surface of the UBM 10. Furthermore, a portion of the underfill material 18 bonded to the side surface of the solder bump 6 and the end surface of the UBM 10 has an obtuse angle θ2.

As such, when the solder bump 6 is formed only on the upper surface of the UBM 10, the location of the solder bump 6 is shifted upward by the thickness of the UBM 10, thereby providing a sufficient fill region 20 which is to be filled with the underfill material 18 and is formed in the vicinity of the junction between the solder bump 6 and the UBM 10 and in the vicinity of the contact between the UBM 10 and the insulating film 9.

As such, the fill region 20 located on the insulating film 9 and around the junction between the solder bump 6 and the UBM 10 has not such an acute angle θ1 as in a conventional semiconductor device but an obtuse angle θ2. Specifically, the shape of the fill region 20 of the underfill material 18 can be prevented from being tapered, resulting in an increase in the volume of the fill region 20. With an increase in the volume of the fill region 20, the permeability of the underfill material 18 penetrating into the fill region 20 through capillary action is increased. With an increase in the permeability of the underfill material 18, the permeability of the particulate filler 19 contained in the underfill material 18 also increases. Therefore, the fill region 20 can be uniformly filled with the necessary amount of the filler 19. Specifically, the fill region 20 outside the junction between the solder bump 6 and the UBM 10 can be uniformly filled with the sufficient filler 19, thereby improving adhesion between the filler 19 and the solder bump 6, the UBM 10, and the insulating film 9. The angle θ2 formed by the side surface of the solder bump 6 and the end surface of the UBM 10 at the junction between the solder bump 6 and the UBM 10 only needs to be any angle except an acute angle, and in other words, may be a right angle.

(Fabrication Method of Embodiment)

A method for fabricating a semiconductor device according to this embodiment will be described hereinafter with reference to FIG. 2 and FIGS. 3A-3I.

Figure 2:
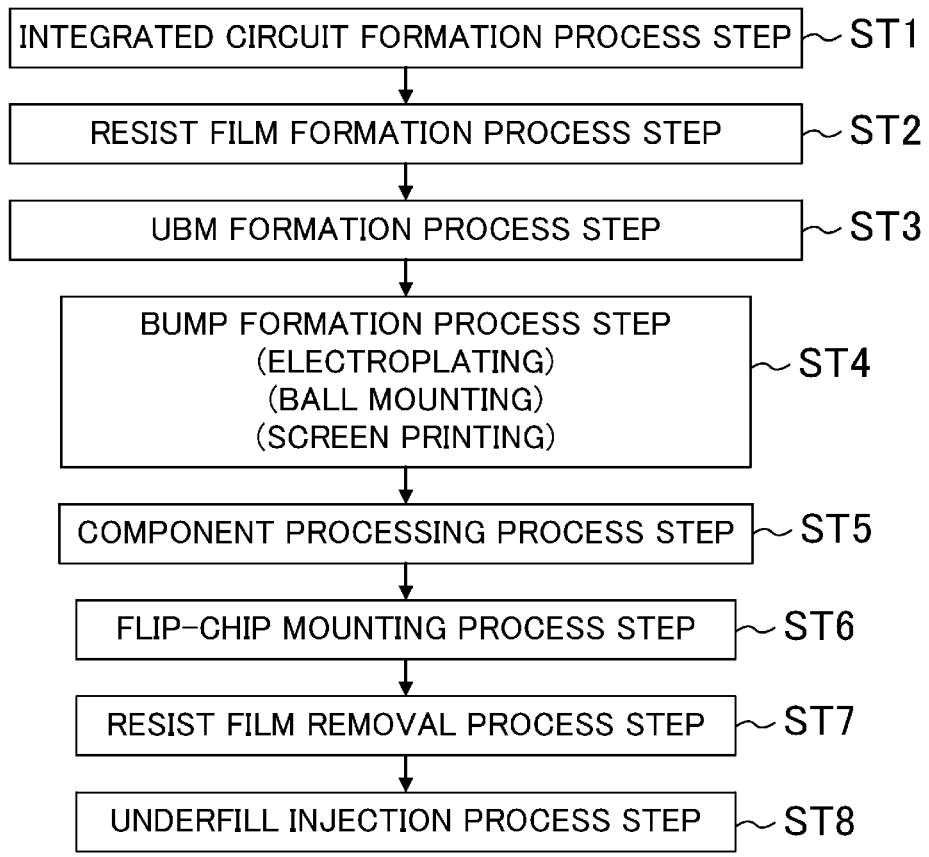
FIG. 2 is a flow chart illustrating a method for fabricating a semiconductor device according to the embodiment of the present disclosure.
Figure 3A:
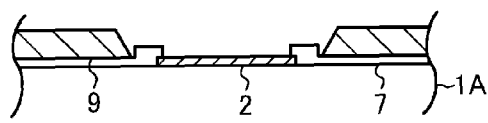
FIGS. 3A-3I are cross-sectional views sequentially illustrating process steps in the method for fabricating a semiconductor device according to the embodiment of the present disclosure.

First, as illustrated in a process step ST1 of FIG. 2 and FIG. 3A, in order to provide electrical connection between a previously formed semiconductor integrated circuit and external connection terminals, a plurality of electrode pads 2 made of aluminum (Al), copper (Cu), gold (Au), etc., are formed on the integrated circuit on a semiconductor wafer 1A through a known diffusion fabrication process. Thereafter, a protective insulating film 7 is formed on the semiconductor wafer 1A to expose the electrode pads 2. Subsequently, an insulating film 9 is formed on the protective insulating film 7 to expose the electrode pads 2 and edge portions of the protective insulating film 7 located near the electrode pads 2. In this case, for example, the end surface of the insulating film 9 located near each of the electrode pads 2 is forwardly tapered when viewed in cross section such that the upper end of the end surface is located outside the lower end thereof.

Figure 3B:
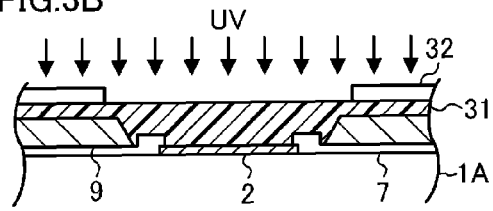

Next, as illustrated in a process step ST2 of FIG. 2 and FIG. 3B, a resist film 31 is formed by being applied onto the entire surface of the semiconductor wafer 1A by, for example, spin coating. Examples of the resist film 31 include a negative resist film 31 which becomes insoluble through ultraviolet (UV) radiation, and a positive resist film 31 which conversely becomes soluble therethrough, and the type of the resist film 31 can be appropriately selected in accordance with the opening shape, the design specification of a mask, etc. Here, the positive resist film 31 is used. Subsequently, a UBM formation mask 32 is formed on the resist film 31 to have an opening over a UBM formation region, is aligned with the semiconductor wafer 1A, is then placed on the semiconductor wafer 1A, and is thereafter irradiated with UV light from above the UBM formation mask 32.

Figure 3C:
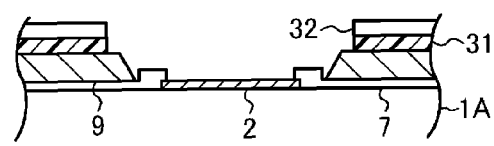
Figure 3D:
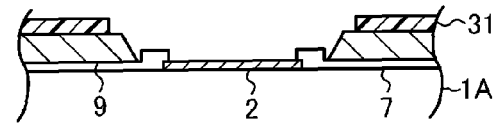

Next, as illustrated in FIG. 3C, when the resist film 31 exposed to light is developed, a portion of the resist film 31 irradiated with UV light dissolves in developer, and thus, the resist film 31 has an opening pattern exposing the UBM formation region. Therefore, the electrode pad 2 is exposed from the opening pattern of the resist film 31. Here, the end surface of the opening pattern of the resist film 31 is substantially perpendicular to the principal surface of the semiconductor wafer 1A. Thereafter, as illustrated in FIG. 3D, the UBM formation mask 32 is removed.

Figure 3E:
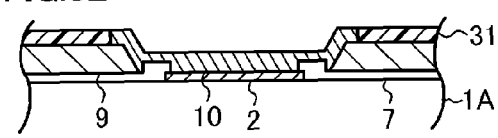

Next, as illustrated in a process step ST3 of FIG. 2 and FIG. 3E, a UBM 10 to be bonded to a solder bump which will be formed in a later process step is formed on the electrode pad 2 by electroplating or electroless plating. Functions demanded of the UBM 10 include low resistance to a bump which is a final metal formed by, e.g., plating, superior solder diffusion barrier performance, and high solder wettability of the uppermost metal layer. To address this, the UBM 10 is formed by laminating different metals, such as titanium (Ti), nickel (Ni), palladium (Pd), gold (Au), or copper (Cu), on the electrode pad 2. This allows physical and electrical connection with a solder bump after the formation of the solder bump. Here, the maximum thickness of the UBM 10 is equal to the thickness of the resist film 31.

Figure 3F:
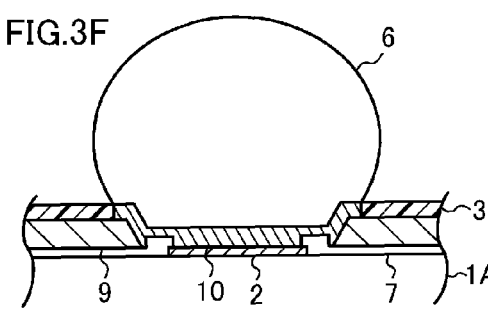

Next, as illustrated in a process step ST4 of FIG. 2 and FIG. 3F, a plurality of solder bumps 6 are formed on the formed UBMs 10 at the same time by electroplating, ball mounting, screen printing, etc. Here, in electroplating, plating resist patterns are formed, as masks, on the UBMs 10, solder plating is performed, and then the plating resist patterns are removed. Thereafter, an unnecessary metal layer is removed by etching, and heat treatment is finally performed, thereby forming solder bumps 6. In ball mounting, flux is screen printed using a mask having an opening for flux printing. Thereafter, balls are mounted using a mask having an opening for ball mounting and heated by a reflow apparatus, an oven, etc., thereby forming solder bumps 6. In screen printing, solder paste is printed using a mask having an opening for solder paste printing. Thereafter, the solder paste is heated in the same way as in ball mounting, thereby forming solder bumps 6. In this case, the shape of the end surface of the UBM 10 coincides with the shape of the end surface of the opening pattern of the resist film 31, and thus, when the end surface of the opening pattern of the resist film 31 is perpendicular to the principal surface of the semiconductor wafer 1A, the end surface of the UBM 10 is also perpendicular thereto.

Figure 3G:
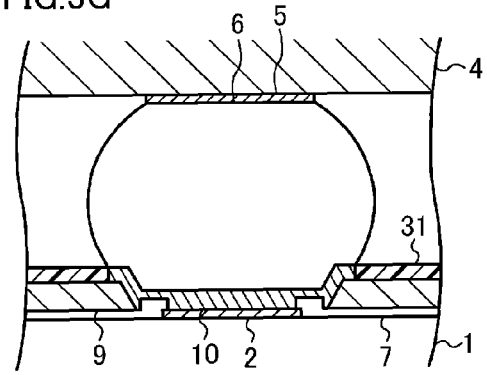

Next, as illustrated in process steps ST5 and ST6 of FIG. 2 and FIG. 3G, the back surface of the semiconductor wafer 1A is polished by a known method, and the semiconductor wafer 1A having a thickness which has been reduced by polishing is diced into chips, thereby obtaining a plurality of semiconductor chips 1. Thereafter, the obtained semiconductor chips 1 are flip-chip mounted on a circuit wiring board (external circuit) 4. In this flip-chip mounting, the solder bumps 6 are aligned with external circuit electrode pads 5 on the circuit wiring board 4 to provide connection therewith. Subsequently, the semiconductor chips 1 and the circuit wiring board 4 are physically and electrically bonded together through the solder bumps 6 by thermal curing.

Figure 3H:
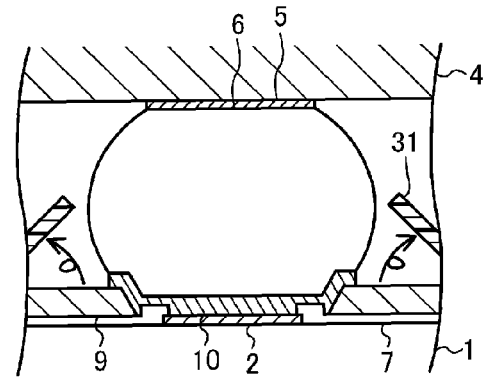

Next, as illustrated in a process step ST7 of FIG. 2 and FIG. 3H, the resist film 31 used to form the UBM 10 is removed by cleaning. The resist film 31 functions to prevent the solder bumps 6 from being bonded to the end surfaces of the UBMs 10, determine the shape of the end surfaces of the UBMs 10, and provide a space between the insulating film 9 and the solder bumps 6. Therefore, after a flip mounting process step, all the functions of the resist film 31 are finished, and thus, the resist film 31 becomes unnecessary. As a method for cleaning the resist film 31, a method in which the resist film 31 is cleaned and removed by immersing the semiconductor chip 1 and the entire surface of the circuit wiring board 4 in a chemical solution is employed in general. Furthermore, if needed, a mechanism for improving cleaning performance, such as a decompression chamber mechanism for removing bubbles left between the solder bumps 6 and allowing a cleaner 34 instead of bubbles to penetrate therebetween, an ultrasonic mechanism for cleaning and removing the resist film 31 by cavitation effect, or a an injection nozzle mechanism which can concentrate the cleaner 34 between the bumps 6, may be used.

Figure 3I:
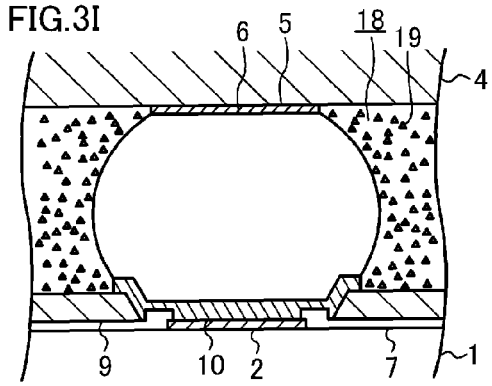

Next, as illustrated in a process step ST8 of FIG. 2 and FIG. 3I, a space between the semiconductor chip 1 and the circuit wiring board 4 is filled with an underfill material 18. In this embodiment, not only a space between the solder bumps 6 but also a space between the solder bumps 6 and the UBMs 10 can be uniformly filled with the necessary amount of the underfill material 18 and the necessary amount of a filler 19 contained in the underfill material 18. This prevents the formation of voids in the underfill material 18, and the underfill material 18 is in close contact with the solder bumps 6, and is fixed to the solder bumps 6, thereby forming a structure which can withstand both stress arising from heating and cooling and physical stress.

As such, according to the fabrication method of this embodiment, in the bump formation process step illustrated in FIG. 3F, the end surface of each of the UBMs 10 is covered with the resist film 31, and thus, the solder bump 6 formed on the UBM 10 is not formed on the end surface of the UBM 10. Moreover, in the resist film removal process step illustrated in FIG. 3H, the resist film 31 is removed, and thus, the angle formed by the side surface of the solder bump 6 and the end surface of the UBM 10 at the junction between the solder bump 6 and the UBM 10 is obtuse. As a result, a space surrounded by the solder bump 6, the UBM 10, and the insulating film 9 can be uniformly filled with a sufficient amount of the underfill material 18 and a sufficient amount of the filler 19.

(First Variation of Embodiment)

A first variation of the embodiment of the present disclosure will be described hereinafter with reference to FIG. 4.

Figure 4:
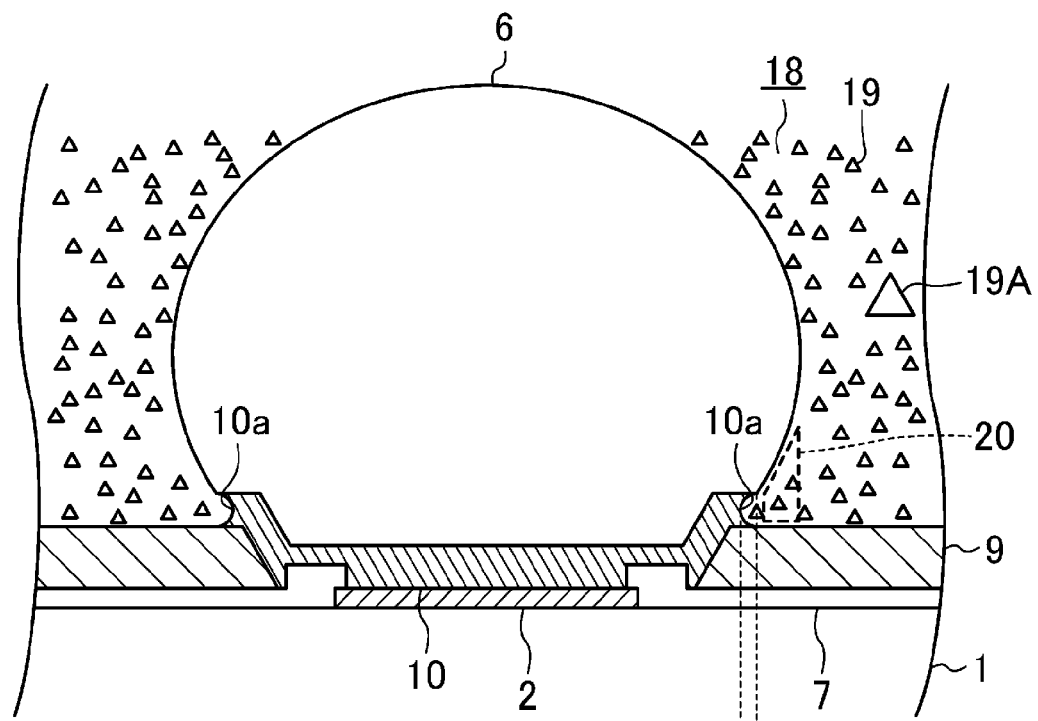
FIG. 4 is a partial schematic cross-sectional view illustrating a region, which includes a bump and a UBM, of a semiconductor device according to a first variation of the embodiment of the present disclosure.
Figure 4:
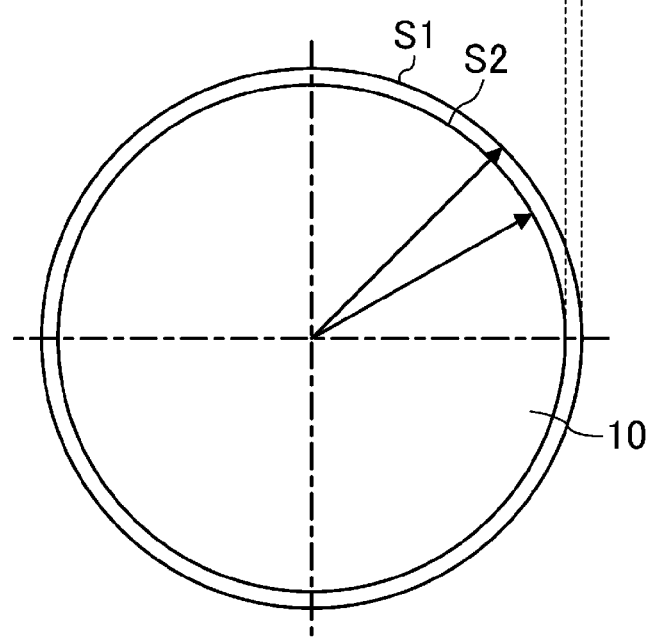

As illustrated in FIG. 4, a feature of a UBM 10 according to this variation is that a central part of the end surface of the UBM 10 in the thickness direction of the UBM 10 is bent inward so that the end surface forms an arc shape.

As described above, in order to provide the effect of the particulate filler 19 added to the underfill material 18, the adhesion of the filler 19 to the solder bump 6 and the UBM 10 needs to be improved. To satisfy this need, in this variation, the end surface of the UBM 10 is bent inward to form an arc shape 10a. This structure can prevent a space around the junction between the solder bump 6 and the UBM 10 from being tapered, thereby allowing easier filling of the filler 19.

The direction in which the end surface of the UBM 10 is bent to form the arc shape 10a is an inward direction of the UBM 10 (toward the center thereof), and specifically, the cross-sectional area of the UBM 10 in a direction parallel to the principal surface of a semiconductor chip 1 is represented by: (Total Area S1 of Top Surface of UBM 10 and Cross Section of Solder Bump 6 Taken at Same Level as Top Surface of UBM 10)>(Total Area S2 of Cross Section of Central Portion of UBM 10 in Thickness Direction and Cross Section of Solder Bump 6 Taken at Same Level as Cross Section of Central Portion).

Here, the difference between the total area Si of the top surface of the UBM 10 and the cross section of the solder bump 6 taken at the same level as the top surface of the UBM 10 and the cross-sectional area S2 of a central portion thereof in the thickness direction can be adjusted in accordance with, e.g., an object of the semiconductor device without having an influence on electrical connection and bond strength.

As illustrated in FIG. 4, when the underfill material 18 contains a filler 19A which is larger than the thickness of the UBM 10, a fill region 20 of the underfill material 18 cannot be filled with the filler 19A. Therefore, in this case, only a solvent penetrate into the fill region 20, and the solvent is vaporized when heated, thereby forming a void.

Here, in order to reliably fill also a space in the vicinity of the junction between the solder bump 6 and the UBM 10 with the filler 19, the particle size of the filler 19 is smaller than the thickness of the UBM 10. The shape of the filler 19 can be a polyhedron but is preferably spherical. The reason for this is that the underfill material 18 penetrates into the space through capillary action. The particle size and shape of the filler 19 can be practiced with the embodiment illustrated in FIG. 1 and FIG. 3.

A method for forming a UBM 10 having an end surface forming an arc shape 10a will be described hereinafter with reference to the drawings.

(First Fabrication Method of First Variation)

Figure 5:
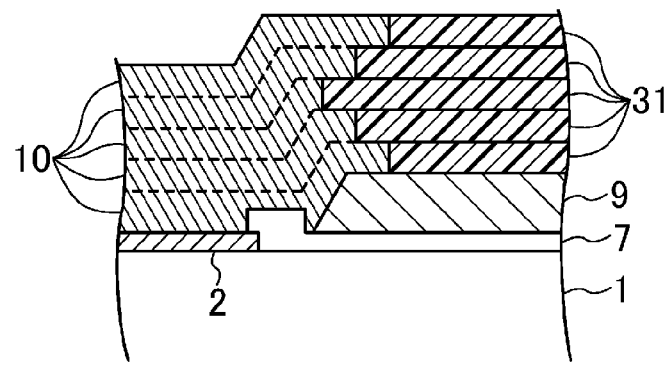
FIG. 5 is a partial cross-sectional view illustrating a process step of a first method for fabricating a semiconductor device according to the first variation of the embodiment of the present disclosure.

In a first fabrication method of the first variation, as illustrated in FIG. 5, a resist film formation process step and a UBM formation process step are alternately carried out, for example, five times. Specifically, after the steps are performed five times, a UBM 10 has a predetermined thickness illustrated in FIG. 4. In this case, furthermore, the size of an opening of the resist film 31 formed in the first resist film formation process step is gradually smaller than that of an opening of the resist film 31 formed in the second resist film formation process step, the size of the opening of the resist film 31 formed in the second resist film formation process step is gradually smaller than that of an opening of the resist film 31 formed in the third resist film formation process step. In contrast, the size of an opening of the resist film 31 formed in the fourth resist film formation process step is gradually larger than that of the opening of the resist film 31 formed in the third resist film formation process step, and the size of an opening of the resist film 31 formed in the fifth resist film formation process step is gradually larger than that of the opening of the resist film 31 formed in the fourth resist film formation process step. This allows the formation of the UBM 10 having a substantially arc-shaped end surface.

Thereafter, a semiconductor device including the solder bump 6 and the UBM 10 both illustrated in FIG. 4 is obtained through the same process steps as in FIGS. 3F-3I.

(Second Fabrication Method of First Variation)

Next, a second fabrication method of the first variation will be described with reference to FIG. 6.

Figure 6:
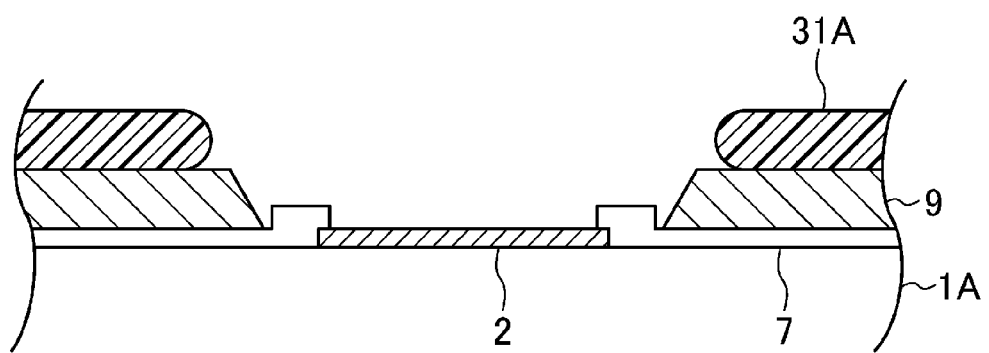
FIG. 6 is a partial cross-sectional view illustrating a process step of a second method for fabricating a semiconductor device according to the first variation of the embodiment of the present disclosure.

In the second fabrication method of the first variation, as illustrated in FIG. 6, a resist film 31A is used instead of laminated resist films 31. Specifically, the resist film 31A forms an arc shape in which a central portion of the end surface of an opening of the resist film 31A in the thickness direction thereof is previously bent toward the center of the opening pattern, and is brought in close contact with the insulating film 9 to expose the electrode pad 2 from the opening pattern and prevent admixture of bubbles.

The shape of the opening of the resist film 31A can be formed in accordance with the conditions on which the UBM 10 is formed. Furthermore, openings forming different shapes can be also formed in the same resist film 31A.

Thereafter, a semiconductor device including the solder bump 6 and the UBM 10 both illustrated in FIG. 4 is obtained through the same process steps as in FIGS. 3E-3I.

(Third Fabrication Method of First Variation)

Next, a third fabrication method of the first variation will be described with reference to FIG. 7.

Figure 7:
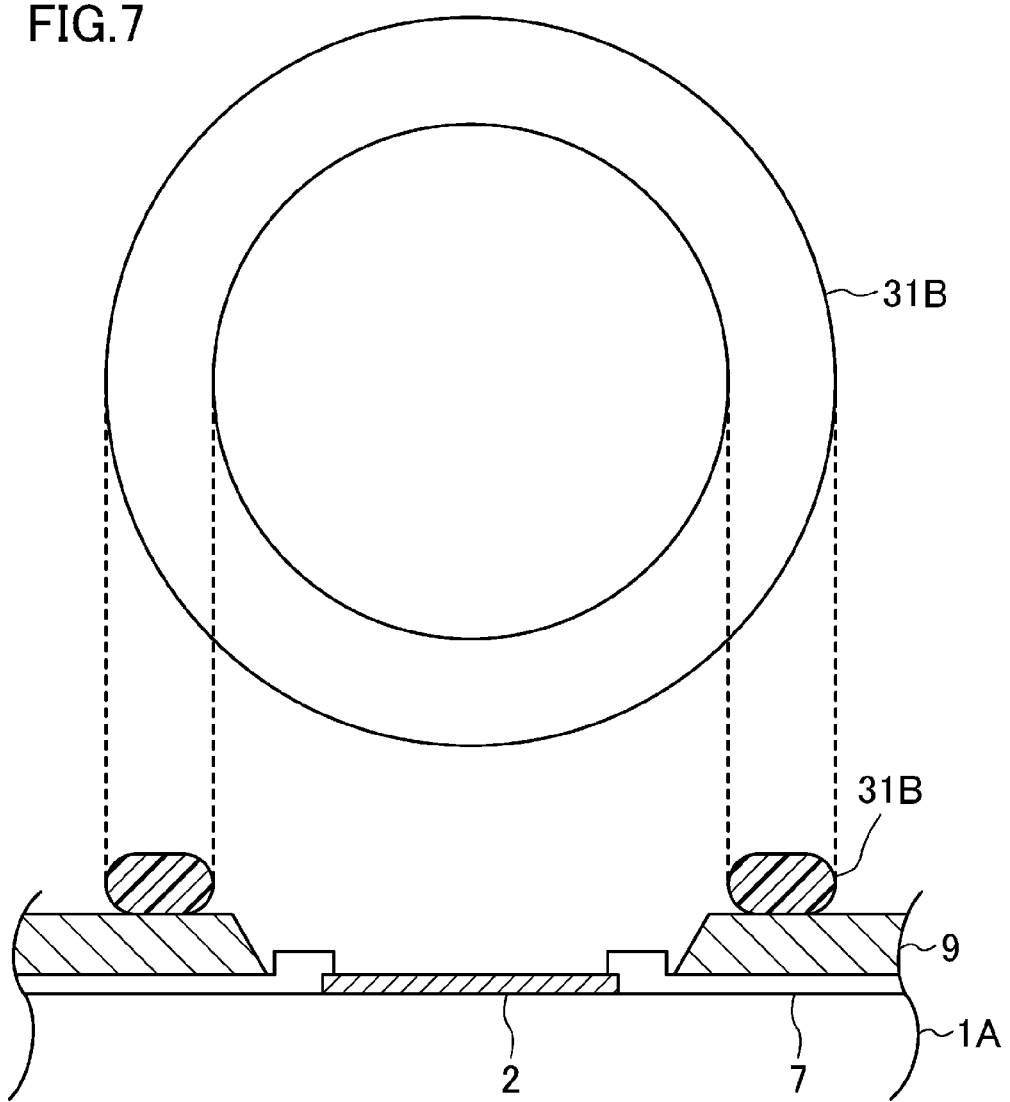
FIG. 7 is a partial cross-sectional view illustrating a process step of a third method for fabricating a semiconductor device according to the first variation of the embodiment of the present disclosure.
Figure 8:
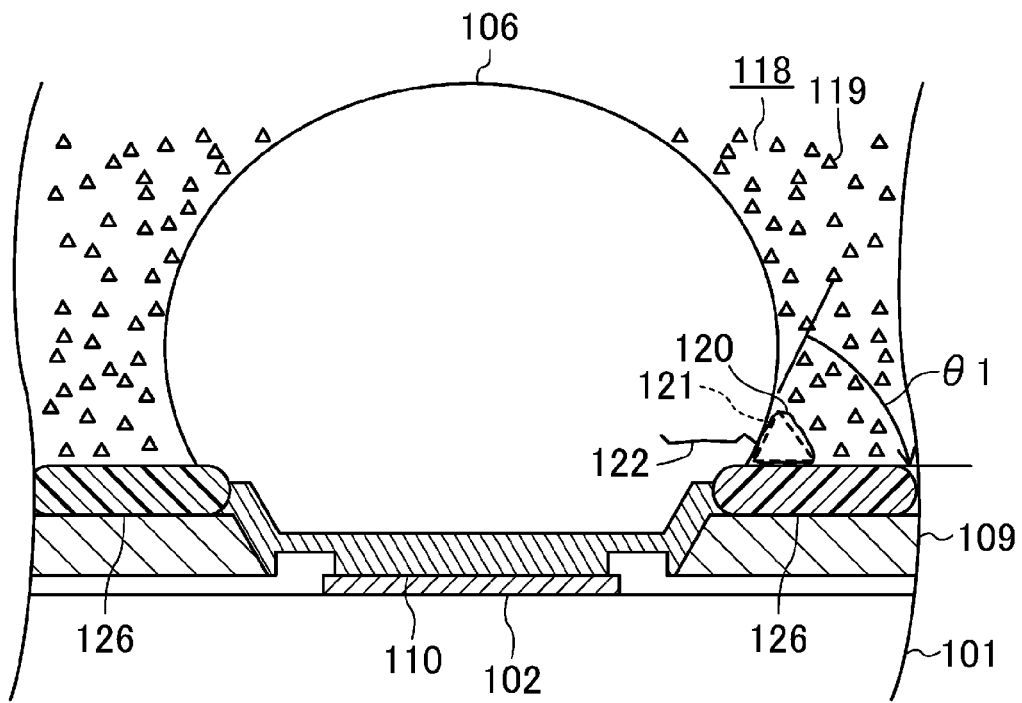
FIG. 8 is a schematic cross-sectional view illustrating an electrode pad structure according to a conventional example.

In the third fabrication method of the first variation, as illustrated in FIG. 7, the end surface of the UBM 10 is formed in an arc shape by using an O ring 31B made of a resist forming an arc shape in which a central portion of the end surface of an opening of the resist in the thickness direction thereof is previously bent toward the center of the opening pattern.

Like the resist film 31A, such an O ring 31B having an arc-shaped end surface can be formed in accordance with the conditions on which the UBM 10 is formed. When the size of the opening is to be varied, the opening can be formed by bringing O rings 31B forming different shapes into close contact with one another.

When the O ring 31B is bonded around a UBM formation region in which the UBM 10 is to be formed, an adhesive is previously applied around the UBM formation region on the insulating film 9 or the bonding surface of the O ring 31B.

Thereafter, a semiconductor device including the solder bump 6 and the UBM 10 both illustrated in FIG. 4 is obtained through the same process steps as in FIGS. 3E-3I.

As described above, in the semiconductor device according to this embodiment and the variation, the underfill material 18 is injected into a space between the solder bumps 6 by utilizing capillary action, and thus, a space in the vicinity of the junction between each of the solder bumps 6 and the corresponding UBM 10 can be also uniformly filled with the necessary amount of the underfill material 18 containing the filler 19. Therefore, the solder bumps 6 are in close contact with the filler 19, and are fixed to the filler 19, thereby mitigating stress-induced strain on a bump junction and maintaining the bond strength which is high enough to withstand both stress arising from heating and cooling and physical stress. This can provide a structure which can accommodate a reduction in the pitch between bumps and includes a solder bump 6 and a UBM 10.

A material of the solder bump 6 is not limited to solder, and an appropriate metal material except solder can be used.

The semiconductor device according to the present disclosure and the method for fabricating the same can mitigate stress-induced strain on a bump junction, and can provide a bump and a UBM structure which can also meet a reduction in the pitch between bumps while maintaining the bond strength. Thus, the present disclosure is useful especially for, for example, a semiconductor device in which a UBM is formed on an external electrode terminal and which includes a semiconductor chip flip-chip mounted to a circuit wiring board.

What is claimed is:
1. A semiconductor device, comprising:
a semiconductor chip;
an electrode pad formed on the semiconductor chip;
an underlying barrier metal formed on the electrode pad;
a bump formed on the underlying barrier metal, and made of metal; and
an underfill material surrounding the underlying barrier metal and the bump, wherein:

a junction interface of the bump with the underlying barrier metal is formed on an upper surface of the underlying barrier metal, a side end surface of the underlying barrier metal forms an arc shape recess in which a central portion of the side end surface is bent inward, and the underfill material is in contact with the side end surface of the underlying barrier metal and the underfill material being in contact with the side end surface includes a filler.

2. The semiconductor device of claim 1, wherein a particle size of the filler is smaller than a thickness of the underlying barrier metal.

3. The semiconductor device of claim 1, wherein the arc shape recess has a half-round shape in a cross section.

4. The semiconductor device of claim 1, wherein a distance from a center portion of the electrode pad to an upper portion of the side end surface is longer in a planar view than a distance from the center portion of the electrode pad to an intermediate portion of the side end surface of the underlying barrier metal.

5. A semiconductor device, comprising:

a semiconductor chip;

an electrode pad disposed on the semiconductor chip;

an underlying barrier metal disposed on the electrode pad;

a bump disposed on the underlying barrier metal; and an underfill material surrounding the underlying barrier metal and the bump, wherein:

the underlying barrier metal includes a first layer having a first side end surface and a second layer disposed on the first layer and having a second side end surface, the underfill material is in contact with to the first and second side end surfaces of the underlying barrier metal and the underfill material being in contact with to the first and second side end surfaces includes a filler, and a distance from a center portion of the electrode pad to the first side end surface is longer in a planar view than a distance from the center portion of the electrode pad to the second side end surface.

6. The semiconductor device of claim 5, wherein:

the underlying barrier metal includes a third layer disposed on the second layer and has a third side end surface, and a distance from the center portion of the electrode pad to the third side end surface is longer in planar view than a distance from the center portion of the electrode pad to the second side end surface.

7. The semiconductor device of claim 5, wherein a particle size of the filler is smaller than a thickness of the underlying barrier metal.

8. The semiconductor device of claim 5, wherein the first layer and the second layer have a substantially same thickness.

9. The semiconductor device of claim 6, wherein the first layer, the second layer and the third layer have a substantially same thickness.

10. The semiconductor device of claim 5, wherein the first layer and the second layer are made of different materials.

11. The semiconductor device of claim 6, wherein the first layer, the second layer and the third layer are made of different materials.

* * * * *